United States Patent
He et al.

(10) Patent No.: US 9,728,403 B2
(45) Date of Patent: Aug. 8, 2017

(54) ARRAY SUBSTRATE AND MANUFACTURING METHOD THEREOF

(71) Applicants: Shenzhen China Star Optoelectronics Technology Co., Ltd., Shenzhen (CN); Wuhan China Star Optoelectronics Technology Co., Ltd., Wuhan (CN)

(72) Inventors: Chao He, Shenzhen (CN); Guoqiang Tang, Shenzhen (CN); Yuan Guo, Shenzhen (CN); Juan Li, Shenzhen (CN); Yuxia Chen, Shenzhen (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY, CO., LTD., Wuhan, Hubei (CN)

( * ) Notice: Subject to any disclaimer, the term of this patent is extended or adjusted under 35 U.S.C. 154(b) by 173 days.

(21) Appl. No.: 14/787,773

(22) PCT Filed: Oct. 13, 2015

(86) PCT No.: PCT/CN2015/091807
§ 371 (c)(1),
(2) Date: Oct. 29, 2015

(87) PCT Pub. No.: WO2017/049676
PCT Pub. Date: Mar. 30, 2017

(65) Prior Publication Data
US 2017/0200600 A1    Jul. 13, 2017

(30) Foreign Application Priority Data

Sep. 22, 2015 (CN) .......................... 2015 1 0609449

(51) Int. Cl.
*H01L 27/12* (2006.01)
*H01L 21/02* (2006.01)
(Continued)

(52) U.S. Cl.
CPC ....... *H01L 21/0242* (2013.01); *G09G 3/2092* (2013.01); *G09G 3/3611* (2013.01); *H01L 21/02576* (2013.01)

(58) Field of Classification Search
None
See application file for complete search history.

(56) References Cited

U.S. PATENT DOCUMENTS

9,553,583 B2 * 1/2017 Yamazaki ................ G09G 3/20
9,634,082 B2 * 4/2017 Yamazaki ........... H01L 21/0242
(Continued)

*Primary Examiner* — Alexander Ghyka
(74) *Attorney, Agent, or Firm* — Leong C. Lei (57) ABSTRACT

The present invention provides an array substrate and a manufacturing method thereof. The manufacturing method of the array substrate according to the present invention forms a gate electrode in the same metal layer with source and drain electrodes and divides a common electrode layer that is conventionally in the form of an entire surface into two portions, of which one serves as a common electrode, while the other portion feeds an input of a gate scan signal thereby eliminating an operation of forming an interlayer insulation layer and thus reducing manufacturing cost of the operation. The array substrate of the present invention comprises a gate electrode that is formed in the same metal layer with source and drain electrodes so that no interlayer insulation layer is present between the gate electrode and the source and drain electrodes, thereby simplifying the structure and reducing the manufacturing cost of the array substrate.

12 Claims, 7 Drawing Sheets

(51) Int. Cl.
    *G09G 3/20*     (2006.01)
    *G09G 3/36*     (2006.01)

(56) References Cited

U.S. PATENT DOCUMENTS

| | | | |
|---|---|---|---|
| 2013/0038569 A1* | 2/2013 | Kim | G06F 3/044 345/174 |
| 2015/0015555 A1* | 1/2015 | Kobayashi | G09G 3/3648 345/209 |
| 2015/0279859 A1* | 10/2015 | Chen | H01L 27/124 257/72 |
| 2016/0351643 A1* | 12/2016 | Xie | H01L 21/77 |
| 2016/0372531 A1* | 12/2016 | Shen | H01L 27/3246 |

\* cited by examiner

ARRAY SUBSTRATE AND MANUFACTURING METHOD THEREOF

BACKGROUND OF THE INVENTION

1. Field of the Invention

The present invention relates to the field of display technology, and in particular to an array substrate and a manufacturing method thereof.

2. The Related Arts

In the field of display technology, the flat panel display techniques have gradually taken the place of cathode ray tube (CRT) display devices. The flat panel display devices have various advantages, such as high image quality, low power consumption, thin device body, and wide applications, and are thus widely used in various consumer electronics, such as mobile phones, televisions, personal digital assistants, digital cameras, notebook computers, and desktop computers and become the mainstream of display devices.

A thin-film transistor (TFT) is a primary driving component of conventional liquid crystal displays (LCDs) and active matrix organic light-emitting diode (AMOLED) displays and has a direct influence on the direction of development of high quality flat panel display devices. There are various structures available for thin-film transistors and there are also various materials that can be used to make the corresponding structures of the thin-film transistors. Among such materials, LTPS (low temperature poly-silicon) is a preferred one. Due the regular arrangement of atoms, LTPS has high carrier mobility, making it possible to drive the rotation of liquid crystal molecules with a size-reduced thin-film transistor thereby reducing, to quite an extent, the space occupied by the thin-film transistor, increasing the area for light transmission, and thus providing greater brightness and resolution. For current-driving active matrix driving organic electroluminescence displays, LTPS TFT may better suit the requirements for driving current.

Thus, LTPS TFT based display panels are favored by the general consumers due to excellent high image quality, high resolution, being ultra thin and light, and low power consumption. The LTPS techniques are gradually taking the place of the conventional amorphous silicon (a-Si) TFT techniques to become the mainstream of the next generation display technology. However, the conventional processes for manufacturing LTPS array substrates are generally complicated and the manufacturing costs are high.

Figure 1:
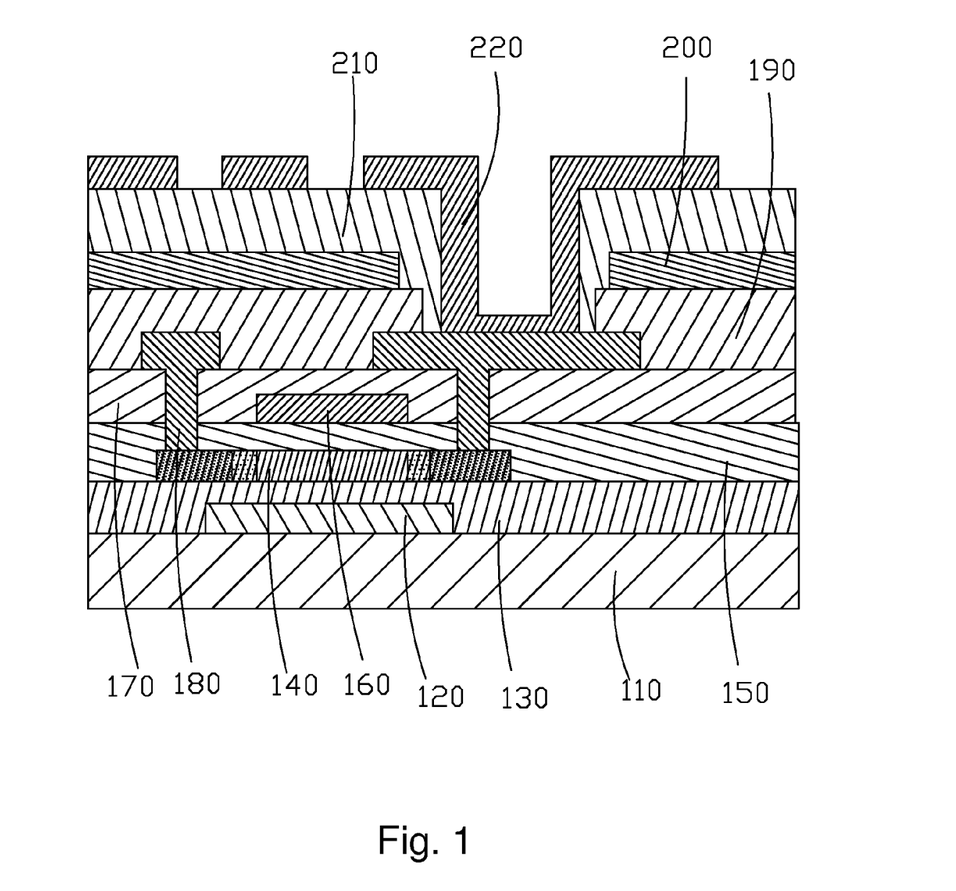
FIG. 1 is a schematic view showing the structure of a conventional CMOS (Complementary Metal Oxide Semiconductor) low-temperature poly-silicon thin-film transistor array substrate.
Figure 2:
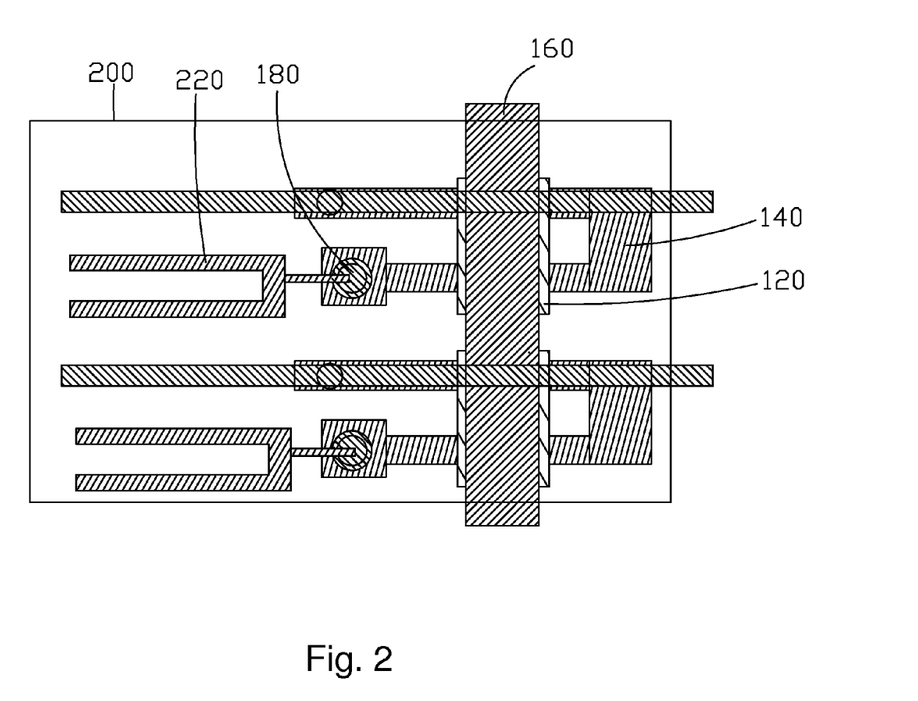
FIG. 2 is a top plan view of the CMOS low-temperature poly-silicon thin-film transistor array substrate of FIG. 1.

As shown in FIG. 1, a conventional complementary metal oxide semiconductor (CMOS) LTPS TFT array substrate comprises a base plate 110, a light shielding layer 120 formed on the base plate 110, a buffer layer 130 formed on the base plate 110 and the light shielding layer 120, an active layer 140 formed on the buffer layer 130, a gate insulation layer 150 formed on the buffer layer 140, a gate electrode 160 formed on the gate insulation layer 150, an interlayer insulation layer 170 formed on the gate electrode 160, source/drain electrodes 180 formed on the interlayer insulation layer 170, a planarization layer 190 formed on the source/drain electrodes 180, a common electrode 200 formed on the planarization layer 190, an insulation layer 210 formed on the common electrode layer 200, and a pixel electrode 220 formed on the insulation layer 210. FIG. 2 is a top plan view of the CMOS LTPS array substrate of FIG. 1, in which the common electrode 200 is a planar electrode of a complete surface. Thus, a conventional process for manufacturing a CMOS LTPS TFT array substrate, after the formation of the gate electrode 160, must form an interlayer insulation layer 170 to function as insulation between the gate electrode 160 and the source/drain electrodes 180. The manufacturing process is complicated and the manufacturing cost is high.

SUMMARY OF THE INVENTION

An object of the present invention is to provide a manufacturing method of an array substrate, in which a gate electrode and source/drain electrodes are formed in the same metal layer and the common electrode that is conventionally of a complete surface is divided into two portions, of which one portion serves as a common electrode, while the other portion helps feeding input of a gate scanning signal of the gate electrode, thereby saving one operation of manufacturing an interlayer insulation layer and thus reducing the manufacturing cost of the operation.

An object of the present invention is also to provide an array substrate, in which a gate electrode and source/drain electrodes are formed in the same metal layer and no interlayer insulation layer is present between the gate electrode and the source/drain electrodes to thereby simplify the structure and thus reduce the manufacturing cost of the operation.

To achieve the above objects, the present invention provides an manufacturing method of an array substrate, which comprises the following steps:

(1) providing a base plate, sequentially forming a light shielding layer and a buffer layer on the base plate, forming a poly-silicon layer on the buffer layer, subjecting two opposite end portions of the poly-silicon layer to N-type ion implantation so as to obtain N-type heavily doped zones that are respectively located at the two end portions of the poly-silicon layer and a non-doped zone located between the two N-type heavily doped zone, and depositing a gate insulation layer on the poly-silicon layer;

(2) coating photoresist on the gate insulation layer and using the half tone mask to subject the photoresist to exposure and development so as to obtain a photoresist layer, wherein the photoresist layer comprises through holes formed therein to correspond to the N-type heavily doped zones and the photoresist layer has a portion that corresponds to and located above the non-doped zone and has a thickness greater than a thickness of a remaining portion of the photoresist layer;

(3) using the photoresist layer as a shielding layer to subject the gate insulation layer to dry etching so as to obtain first vias corresponding to and located above the N-type heavily doped zones and subjecting the photoresist layer to oxygen ashing treatment so that after the oxygen ashing treatment, a remaining portion of the photoresist layer is left and located above the non-doped zone of the poly-silicon layer and has a size less than that of the non-doped zone;

(4) using the remaining portion of the photoresist layer as a shielding layer to conduct N-type ion implantation on two end portions of the non-doped zone so as to form N-type lightly-doped zones respectively on the two end portions of the non-doped zone and define a channel zone in a non-doped area between the two N-type lightly-doped zones; and removing the photoresist layer, depositing a metal layer on the gate insulation layer, and patterning the metal layer to form a gate electrode, a source electrode, and a drain electrode, wherein the gate electrode, the source electrode, and the drain electrode are not connected with each other and the source electrode and the drain electrode are respectively connected through the first via to the N-type heavily doped zones;

(5) forming a planarization layer on the gate electrode, the source electrode, and the drain electrode and applying a photolithographic operation to form, in the planarization layer, a second via that corresponds to and is located above the gate electrode and a third via that corresponds to and is located above the drain electrode; and (6) forming an ITO film on the planarization layer and patterning the ITO film to obtain a common electrode and a transparent electrode, wherein the transparent electrode is connected through the second via to the gate electrode to allow a gate scan signal to be fed through the transparent electrode to the gate electrode.

In step (2), the half tone mask comprises light-transmitting areas, a partial light-transmitting area, and a light-blocking area and in the exposure operation, the light-transmitting areas are located above the N-type heavily doped zones and the light-blocking area is located above the non-doped zone.

In step (4), the base plate is subjected to rapid thermal annealing before the deposition of the metal layer.

The buffer layer comprises a laminated structure composed of a silicon nitride film and a silicon oxide film; and the poly-silicon layer is formed of a material comprising low-temperature poly-silicon.

The manufacturing method further comprises step (7) of forming an insulation layer on the common electrode and the transparent electrode and forming a pixel electrode on the insulation layer in such a way that the pixel electrode is connected via the third via of the planarization layer to the drain electrode.

The present invention also provides an array substrate, which comprises a base plate, a light shielding layer formed on the base plate, a buffer layer formed on the base plate and the light shielding layer, a poly-silicon layer formed on the buffer layer, a gate insulation layer formed on the poly-silicon layer, a gate electrode, a source electrode, and a drain electrode formed on the gate insulation layer, a planarization layer formed on the gate insulation layer, the gate electrode, the source electrode, and the drain electrode, and a common electrode a the transparent electrode formed on the planarization layer;

the poly-silicon layer comprising N-type heavily doped zones respectively located at two end portions of the poly-silicon layer and a channel zone locate between the two N-type heavily doped zones;

the gate insulation layer comprising first vias formed therein to correspond to the N-type heavily doped zones, the planarization layer comprising, formed therein, a second via corresponding to the gate electrode and a third via corresponding to the drain electrode, the transparent electrode being connected through the second via to the gate electrode to allow a gate scan signal to be fed through the transparent electrode to the gate electrode.

The poly-silicon layer further comprises N-type lightly-doped zones respectively located between the channel zone and the N-type heavily doped zones; and the source electrode and the drain electrode are respectively connected through the first vias to the N-type heavily doped zones.

The gate electrode, the source electrode, and the drain electrode are formed through a photolithographic operation conducted on the same metal layer and the common electrode and the transparent electrode are formed through a photolithographic operation conducted on the same ITO film.

The buffer layer comprises a laminated structure composed of a silicon nitride film and a silicon oxide film; and the poly-silicon layer is formed of a material comprising low-temperature poly-silicon.

The array substrate further comprises an insulation layer formed on the common electrode and the transparent electrode and a pixel electrode formed on the insulation layer, the pixel electrode being connected through the third via of the planarization layer to the drain electrode.

The present invention further provides an array substrate, which comprises a base plate, a light shielding layer formed on the base plate, a buffer layer formed on the base plate and the light shielding layer, a poly-silicon layer formed on the buffer layer, a gate insulation layer formed on the poly-silicon layer, a gate electrode, a source electrode, and a drain electrode formed on the gate insulation layer, a planarization layer formed on the gate insulation layer, the gate electrode, the source electrode, and the drain electrode, and a common electrode a the transparent electrode formed on the planarization layer;

the poly-silicon layer comprising N-type heavily doped zones respectively located at two end portions of the poly-silicon layer and a channel zone locate between the two N-type heavily doped zones;

the gate insulation layer comprising first vias formed therein to correspond to the N-type heavily doped zones, the planarization layer comprising, formed therein, a second via corresponding to the gate electrode and a third via corresponding to the drain electrode, the transparent electrode being connected through the second via to the gate electrode to allow a gate scan signal to be fed through the transparent electrode to the gate electrode;

wherein the poly-silicon layer further comprises N-type lightly-doped zones respectively located between the channel zone and the N-type heavily doped zones; and the source electrode and the drain electrode are respectively connected through the first vias to the N-type heavily doped zones;

wherein the gate electrode, the source electrode, and the drain electrode are formed through a photolithographic operation conducted on the same metal layer and the common electrode and the transparent electrode are formed through a photolithographic operation conducted on the same ITO film; and wherein the array substrate further comprises an insulation layer formed on the common electrode and the transparent electrode and a pixel electrode formed on the insulation layer, the pixel electrode being connected through the third via of the planarization layer to the drain electrode.

The efficacy of the present invention is that the present invention provides an array substrate and a manufacturing method thereof. The manufacturing method of the array substrate according to the present invention forms a gate electrode in the same metal layer with source and drain electrodes and divides a common electrode layer that is conventionally in the form of an entire surface into two portions, of which one serves as a common electrode, while the other portion feeds an input of a gate scan signal thereby eliminating an operation of forming an interlayer insulation layer and thus reducing manufacturing cost of the operation. The array substrate of the present invention comprises a gate electrode that is formed in the same metal layer with source and drain electrodes so that no interlayer insulation layer is present between the gate electrode and the source and drain electrodes, thereby simplifying the structure and reducing the manufacturing cost of the array substrate.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
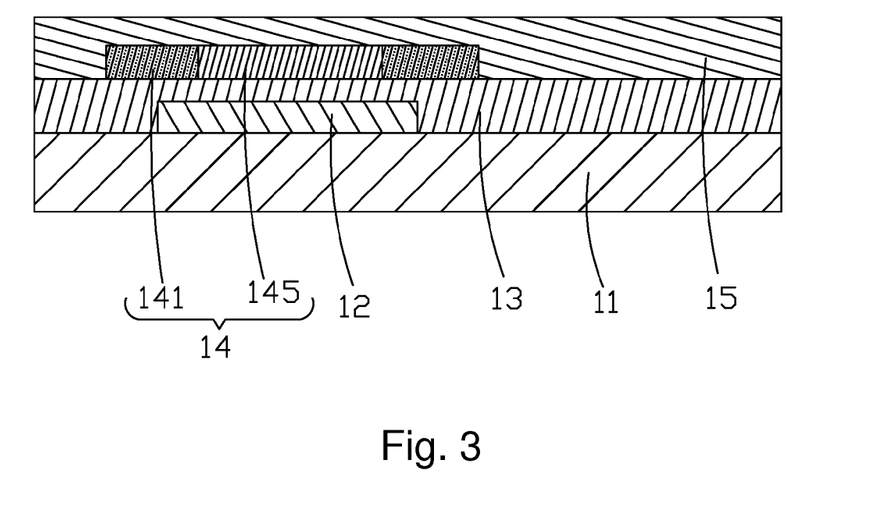
FIG. 3 is a schematic view illustrating a first step of a manufacturing method of an array substrate according to the present invention.

Referring to FIGS. 3-10, the present invention provides a manufacturing method of an array substrate, which comprises the following steps:

Step 1: as shown in FIG. 3, providing a base plate 11, sequentially forming a light shielding layer 12 and a buffer layer 13 on the base plate 11, forming a poly-silicon layer 14 on the buffer layer 13, subjecting two opposite end portions of the poly-silicon layer 14 to N-type ion implantation so as to obtain N-type heavily doped zones 141 that are respectively located at the two end portions of the poly-silicon layer 14 and a non-doped zone 145 located between the two N-type heavily doped zone 141, and depositing a gate insulation layer 15 on the poly-silicon layer 14.

Specifically, the buffer layer 12 comprises a laminated structure composed of a silicon nitride film and a silicon oxide film.

Specifically, the poly-silicon layer 14 is formed of a material comprising low-temperature poly-silicon.

Figure 4:
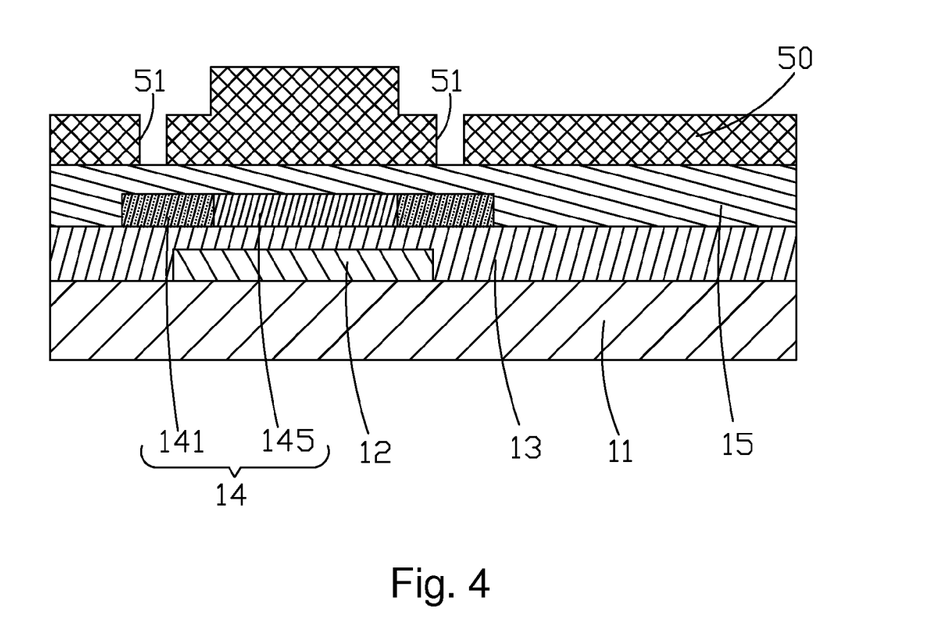
FIG. 4 is a schematic view illustrating a second step of the manufacturing method of an array substrate according to the present invention.

Step 2: as shown in FIG. 4, coating photoresist on the gate insulation layer 15 and using the half tone mask to subject the photoresist to exposure and development so as to obtain a photoresist layer 50, wherein the photoresist layer 50 comprises through holes 51 formed therein to correspond to the N-type heavily doped zones 141 and the photoresist layer 50 has a portion that corresponds to and located above the non-doped zone 145 and has a thickness greater than a thickness of a remaining portion of the photoresist layer.

Specifically, the half tone mask comprises light-transmitting areas, a partial light-transmitting area, and a light-blocking area, and in the exposure operation, the light-transmitting areas are located above the N-type heavily doped zones 141 for forming vias in the gate insulation layer 15 above the N-type heavily doped zone 142 and the light-blocking area is located above the non-doped zone 145.

Figure 5:
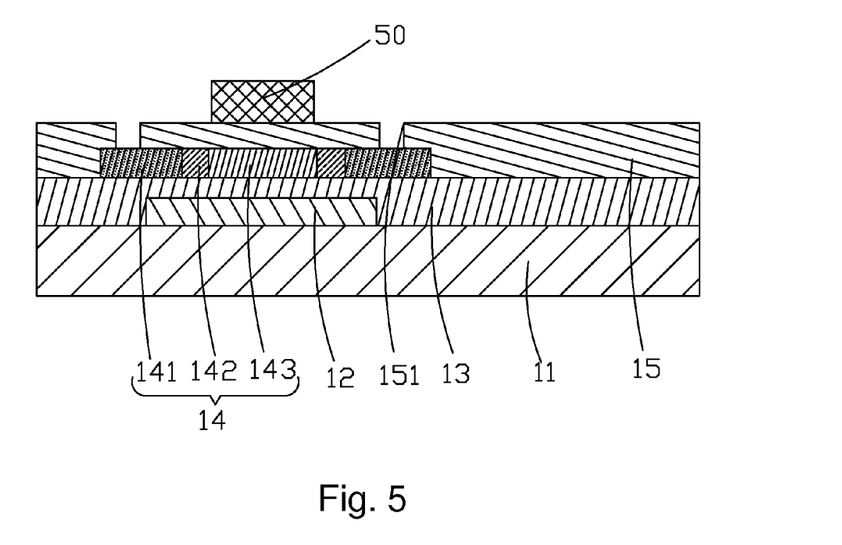
FIG. 5 is a schematic view illustrating a third step of the manufacturing method of an array substrate according to the present invention.

Step 3: as shown in FIG. 5, using the photoresist layer 50 as a shielding layer to subject the gate insulation layer 15 to dry etching so as to obtain first vias 151 corresponding to and located above the N-type heavily doped zones 141 and subjecting the photoresist layer 50 to oxygen ashing treatment so that after the oxygen ashing treatment, a remaining portion of the photoresist layer 50 is left and located above the non-doped zone 145 of the poly-silicon layer 14 and has a size less than that of the non-doped zone 145.

Figure 6:
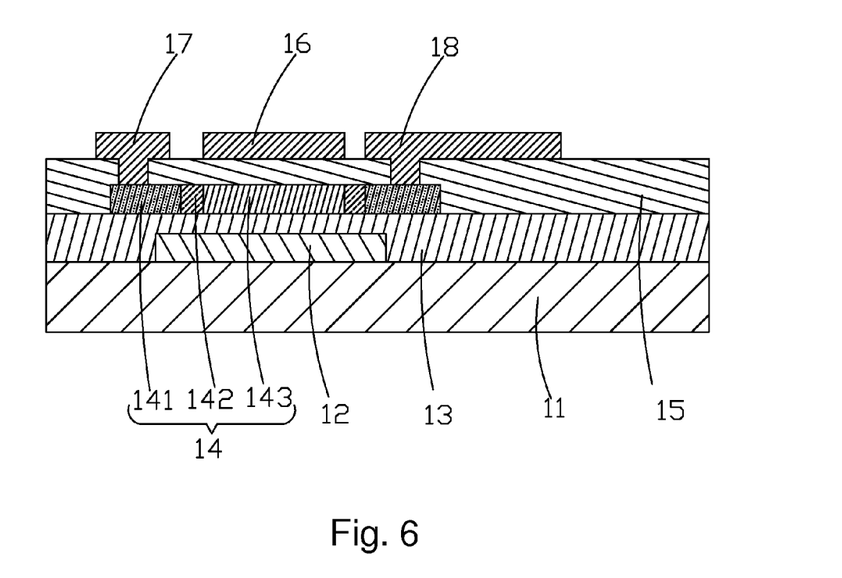
FIG. 6 is a schematic view illustrating a fourth step of the manufacturing method of an array substrate according to the present invention.
Figure 7:
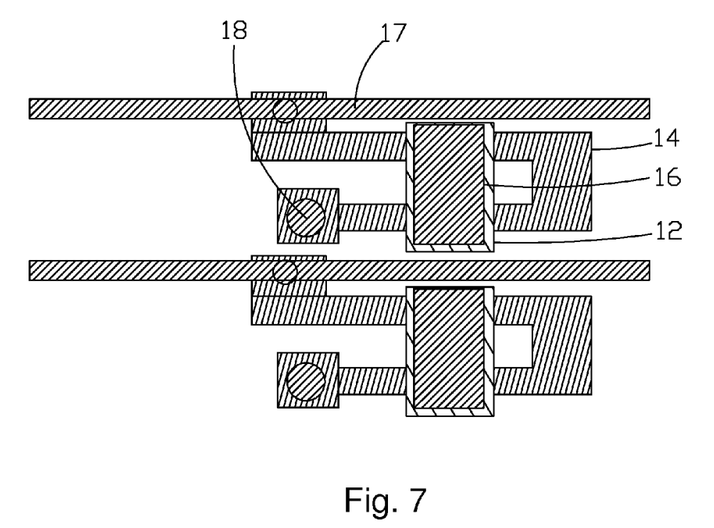
FIG. 7 is a top plan view illustrating the fourth step of the manufacturing method of an array substrate according to the present invention.

Step 4: as shown in FIG. 6, using the remaining portion of the photoresist layer 50 as a shielding layer to conduct N-type ion implantation on two end portions of the non-doped zone 145 so as to form N-type lightly-doped zones 142 respectively on the two end portions of the non-doped zone 145 and define a channel zone 143 in a non-doped area between the two N-type lightly-doped zones 142; and removing the photoresist layer 50, applying physical vapor deposition to deposit a metal layer on the gate insulation layer 15 and patterning the metal layer to form a gate electrode 16, a source electrode 17, and a drain electrode 18, wherein the gate electrode 16, the source electrode 17, and the drain electrode 18 are not connected with each other and the source electrode 17 and the drain electrode 18 are respectively connected through the first via 151 to the N-type heavily doped zones 14, whereby the base plate exhibits a top plan view as that shown in FIG. 7.

Specifically, in Step 4, before the deposition of the metal layer, it is necessary to subject the base plate 11 to rapid thermal annealing (RTA) for replenishment of hydrogen and activation of the poly-silicon layer 14.

Figure 8:
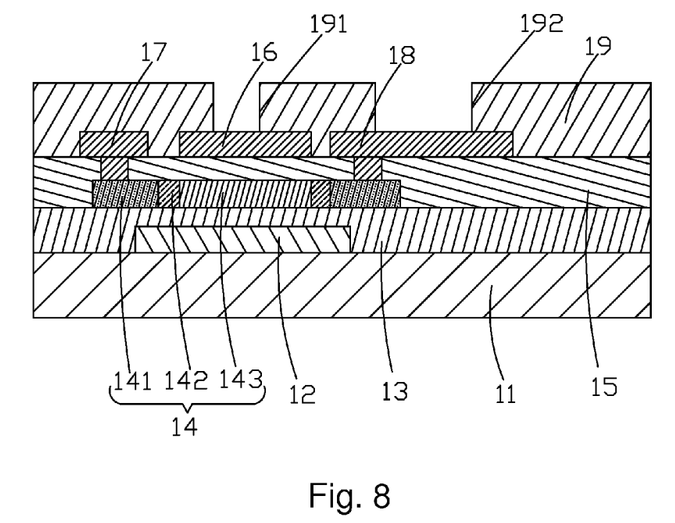
FIG. 8 is a schematic view illustrating a fifth step of the manufacturing method of an array substrate according to the present invention.

Step 5: as shown in FIG. 8, forming a planarization layer 19 on the gate electrode 16, the source electrode 17, and the drain electrode 18 and applying a photolithographic operation to form, in the planarization layer 19, a second via 191 that corresponds to and is located above the gate electrode 16 and a third via 192 that corresponds to and is located above the drain electrode 18.

Figure 9:
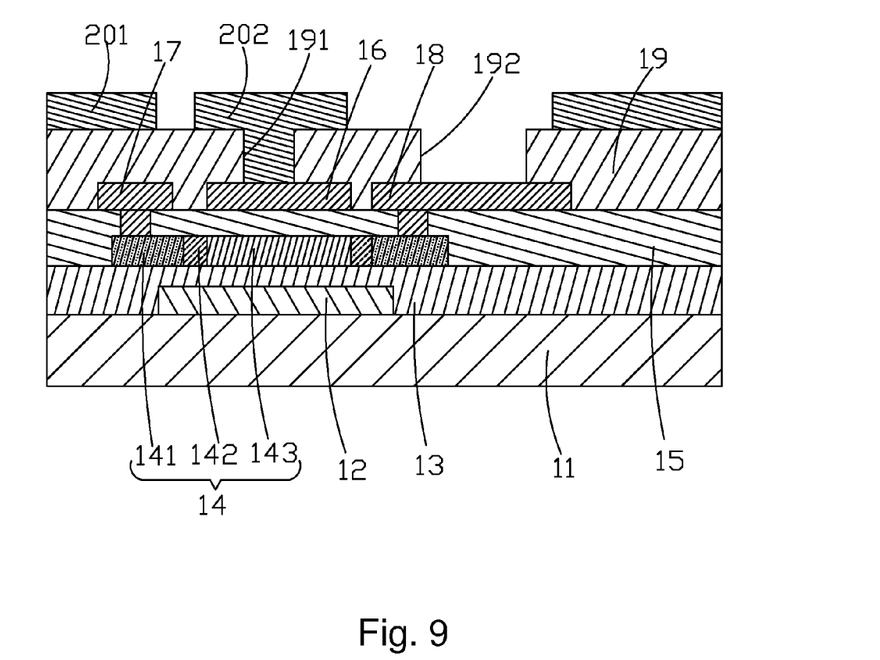
FIG. 9 is a schematic view illustrating a sixth step of the manufacturing method of an array substrate according to the present invention.
Figure 10:
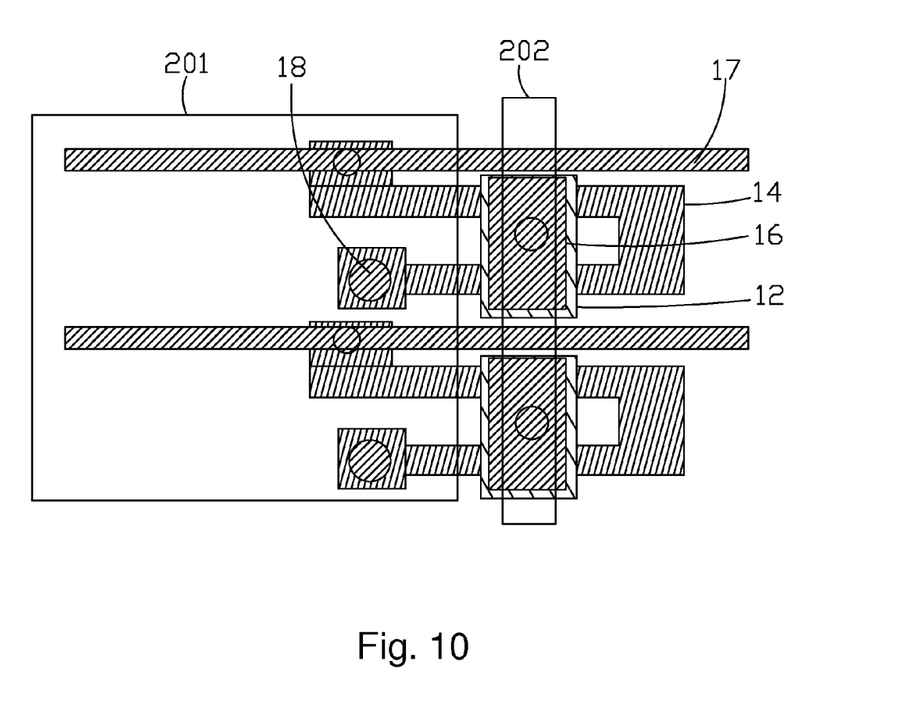
FIG. 10 is a top plan view illustrating the sixth step of the manufacturing method of an array substrate according to the present invention.

Step 6: as shown in FIG. 9, forming an indium tin oxide (ITO) film on the planarization layer 19 and patterning the ITO film to obtain a common electrode 201 and a transparent electrode 202, wherein the transparent electrode 202 is connected through the second via 191 to the gate electrode 16 to allow a gate scan signal to be fed through the transparent electrode 202 to the gate electrode 16 to establish conduction between the source electrode 17 and the drain electrode 18, whereby the base plate exhibits a top plan view as that shown in FIG. 10. Specifically, the transparent electrode 202 is connected, through the second via 191 in the same row, to the gate electrode 16 in the row thereby achieving feeding through the gate scan signal line and also forming a vertical circuit between the source electrode 17 and the drain electrode 18.

Specifically, the manufacturing method of the array substrate further comprises Step 7: forming an insulation layer on the common electrode 201 and the transparent electrode 202 and forming a pixel electrode on the insulation layer in such a way that the pixel electrode is connected via the third via 192 of the planarization layer 19 to the drain electrode 18.

Referring to FIGS. 9-10, the present invention also provides an array substrate, which comprises a base plate 11, a light shielding layer 12 formed on the base plate 11, a buffer layer 13 formed on the base plate 11 and the light shielding layer 12, a poly-silicon layer 14 formed on the buffer layer 13, a gate insulation layer 15 formed on the poly-silicon layer 14, a gate electrode 16, a source electrode 17, and a drain electrode 18 formed on the gate insulation layer 15, a planarization layer 19 formed on the gate insulation layer 15, the gate electrode 16, the source electrode 17, and the drain electrode 18, and a common electrode 201 and a transparent electrode 202 formed on the planarization layer 19.

The poly-silicon layer 14 comprises a channel zone 143 located in a middle portion thereof, N-type heavily doped zones 141 located at two end portions thereof, and N-type lightly-doped zones 142 respectively located between the channel zone 143 and the N-type heavily doped zones 141.

The gate insulation layer 15 comprises first vias 151 formed therein to correspond to the N-type heavily doped zones 141. The planarization layer 19 comprises, formed therein, a second via 191 corresponding to the gate electrode 16 and a third via 192 corresponding to the drain electrode 18. The transparent electrode 202 is connected through the second via 191 to the gate electrode 16 to allow a gate scan signal to be fed through the transparent electrode 202 to the gate electrode 16 to establish conduction between the source electrode 17 and the drain electrode 18.

Specifically, the source electrode 17 and the drain electrode 18 are respectively connected through the first vias 151 to the N-type heavily doped zones 141.

Specifically, the array substrate further comprises an insulation layer formed on the common electrode 201 and the transparent electrode 202 and a pixel electrode formed on the insulation layer. The pixel electrode is connected through the third via 192 of the planarization layer 19 to the drain electrode 18.

Specifically, the gate electrode 16, the source electrode 17, and the drain electrode 18 are formed through a photolithographic operation applied to the same metal layer and the common electrode 201 and the transparent electrode 202 are formed through photolithographic operation applied to the same ITO film.

Specifically, the array substrate provided in the present invention is a complementary metal oxide semiconductor (CMOS) low-temperature poly-silicon thin-film transistor array substrate. The array substrate of the present invention is applicable to an IPS (In-Plane Switching) liquid crystal display or an FFS (Fringe Field Switching) liquid crystal display.

Specifically, the buffer layer 12 comprises a laminated structure composed of a silicon nitride film and a silicon oxide film.

Specifically, the poly-silicon layer 14 is formed of a material comprising low-temperature poly-silicon.

In summary, the present invention provides an array substrate and a manufacturing method thereof. The manufacturing method of the array substrate according to the present invention forms a gate electrode in the same metal layer with source and drain electrodes and divides a common electrode layer that is conventionally in the form of an entire surface into two portions, of which one serves as a common electrode, while the other portion feeds an input of a gate scan signal thereby eliminating an operation of forming an interlayer insulation layer and thus reducing manufacturing cost of the operation. The array substrate of the present invention comprises a gate electrode that is formed in the same metal layer with source and drain electrodes so that no interlayer insulation layer is present between the gate electrode and the source and drain electrodes, thereby simplifying the structure and reducing the manufacturing cost of the array substrate.

Based on the description given above, those having ordinary skills of the art may easily contemplate various changes and modifications of the technical solution and technical ideas of the present invention and all these changes and modifications are considered within the protection scope of right for the present invention.

What is claimed is:
1. A manufacturing method of an array substrate, comprising the following steps:
(1) providing a base plate, sequentially forming a light shielding layer and a buffer layer on the base plate, forming a poly-silicon layer on the buffer layer, subjecting two opposite end portions of the poly-silicon layer to N-type ion implantation so as to obtain N-type heavily doped zones that are respectively located at the two end portions of the poly-silicon layer and a non-doped zone located between the two N-type heavily doped zone, and depositing a gate insulation layer on the poly-silicon layer;
(2) coating photoresist on the gate insulation layer and using the half tone mask to subject the photoresist to exposure and development so as to obtain a photoresist layer, wherein the photoresist layer comprises through holes formed therein to correspond to the N-type heavily doped zones and the photoresist layer has a portion that corresponds to and located above the non-doped zone and has a thickness greater than a thickness of a remaining portion of the photoresist layer;
(3) using the photoresist layer as a shielding layer to subject the gate insulation layer to dry etching so as to obtain first vias corresponding to and located above the N-type heavily doped zones and subjecting the photoresist layer to oxygen ashing treatment so that after the oxygen ashing treatment, a remaining portion of the photoresist layer is left and located above the non-doped zone of the poly-silicon layer and has a size less than that of the non-doped zone;
(4) using the remaining portion of the photoresist layer as a shielding layer to conduct N-type ion implantation on two end portions of the non-doped zone so as to form N-type lightly-doped zones respectively on the two end portions of the non-doped zone and define a channel zone in a non-doped area between the two N-type lightly-doped zones; and removing the photoresist layer, depositing a metal layer on the gate insulation layer, and patterning the metal layer to form a gate electrode, a source electrode, and a drain electrode, wherein the gate electrode, the source electrode, and the drain electrode are not connected with each other and the source electrode and the drain electrode are respectively connected through the first via to the N-type heavily doped zones;
(5) forming a planarization layer on the gate electrode, the source electrode, and the drain electrode and applying a photolithographic operation to form, in the planarization layer, a second via that corresponds to and is located above the gate electrode and a third via that corresponds to and is located above the drain electrode; and

(6) forming an indium tin oxide (ITO) film on the planarization layer and patterning the ITO film to obtain a common electrode and a transparent electrode, wherein the transparent electrode is connected through the second via to the gate electrode to allow a gate scan signal to be fed through the transparent electrode to the gate electrode.

2. The manufacturing method of the array substrate as claimed in claim 1, wherein in step (2), the half tone mask comprises light-transmitting areas, a partial light-transmitting area, and a light-blocking area and in the exposure operation, the light-transmitting areas are located above the N-type heavily doped zones and the light-blocking area is located above the non-doped zone.

3. The manufacturing method of the array substrate as claimed in claim 1, wherein in step (4), the base plate is subjected to rapid thermal annealing before the deposition of the metal layer.

4. The manufacturing method of the array substrate as claimed in claim 1, wherein the buffer layer comprises a laminated structure composed of a silicon nitride film and a silicon oxide film; and the poly-silicon layer is formed of a material comprising low-temperature poly-silicon.

5. The manufacturing method of the array substrate as claimed in claim 1 further comprising step (7) of forming an insulation layer on the common electrode and the transparent electrode and forming a pixel electrode on the insulation layer in such a way that the pixel electrode is connected via the third via of the planarization layer to the drain electrode.

6. An array substrate, comprising a base plate, a light shielding layer formed on the base plate, a buffer layer formed on the base plate and the light shielding layer, a poly-silicon layer formed on the buffer layer, a gate insulation layer formed on the poly-silicon layer, a gate electrode, a source electrode, and a drain electrode formed on the gate insulation layer, a planarization layer formed on the gate insulation layer, the gate electrode, the source electrode, and the drain electrode, and a common electrode a the transparent electrode formed on the planarization layer;
the poly-silicon layer comprising N-type heavily doped zones respectively located at two end portions of the poly-silicon layer and a channel zone locate between the two N-type heavily doped zones;
the gate insulation layer comprising first vias formed therein to correspond to the N-type heavily doped zones, the planarization layer comprising, formed therein, a second via corresponding to the gate electrode and a third via corresponding to the drain electrode, the transparent electrode being connected through the second via to the gate electrode to allow a gate scan signal to be fed through the transparent electrode to the gate electrode.

7. The array substrate as claimed in claim 6, wherein the poly-silicon layer further comprises N-type lightly-doped zones respectively located between the channel zone and the N-type heavily doped zones; and the source electrode and the drain electrode are respectively connected through the first vias to the N-type heavily doped zones.

8. The array substrate as claimed in claim 6, wherein the gate electrode, the source electrode, and the drain electrode are formed through a photolithographic operation conducted on the same metal layer and the common electrode and the transparent electrode are formed through a photolithographic operation conducted on the same indium tin oxide (ITO) film.

9. The array substrate as claimed in claim 8, wherein the buffer layer comprises a laminated structure composed of a silicon nitride film and a silicon oxide film; and the poly-silicon layer is formed of a material comprising low-temperature poly-silicon.

10. The array substrate as claimed in claim 6, wherein the array substrate further comprises an insulation layer formed on the common electrode and the transparent electrode and a pixel electrode formed on the insulation layer, the pixel electrode being connected through the third via of the planarization layer to the drain electrode.

11. An array substrate, comprising a base plate, a light shielding layer formed on the base plate, a buffer layer formed on the base plate and the light shielding layer, a poly-silicon layer formed on the buffer layer, a gate insulation layer formed on the poly-silicon layer, a gate electrode, a source electrode, and a drain electrode formed on the gate insulation layer, a planarization layer formed on the gate insulation layer, the gate electrode, the source electrode, and the drain electrode, and a common electrode a the transparent electrode formed on the planarization layer;
the poly-silicon layer comprising N-type heavily doped zones respectively located at two end portions of the poly-silicon layer and a channel zone locate between the two N-type heavily doped zones;
the gate insulation layer comprising first vias formed therein to correspond to the N-type heavily doped zones, the planarization layer comprising, formed therein, a second via corresponding to the gate electrode and a third via corresponding to the drain electrode, the transparent electrode being connected through the second via to the gate electrode to allow a gate scan signal to be fed through the transparent electrode to the gate electrode;
wherein the poly-silicon layer further comprises N-type lightly-doped zones respectively located between the channel zone and the N-type heavily doped zones; and the source electrode and the drain electrode are respectively connected through the first vias to the N-type heavily doped zones;
wherein the gate electrode, the source electrode, and the drain electrode are formed through a photolithographic operation conducted on the same metal layer and the common electrode and the transparent electrode are formed through a photolithographic operation conducted on the same indium tin oxide (ITO) film; and
wherein the array substrate further comprises an insulation layer formed on the common electrode and the transparent electrode and a pixel electrode formed on the insulation layer, the pixel electrode being connected through the third via of the planarization layer to the drain electrode.

12. The array substrate as claimed in claim 11, wherein the buffer layer comprises a laminated structure composed of a silicon nitride film and a silicon oxide film; and the poly-silicon layer is formed of a material comprising low-temperature poly-silicon.

* * * * *